US009189990B2

(12) United States Patent
Park et al.

(10) Patent No.: US 9,189,990 B2
(45) Date of Patent: Nov. 17, 2015

(54) ORGANIC LIGHT EMITTING DIODE DISPLAY

(71) Applicant: Samsung Display Co., Ltd., Yongin, Gyeonggi-Do (KR)

(72) Inventors: Kyung-Min Park, Yongin (KR); Tae-Gon Kim, Yongin (KR); Se-Ho Kim, Yongin (KR)

(73) Assignee: Samsung Display Co., Ltd., Samsung-ro, Giheung-Gu, Yongin-si, Gyeonggi-Do (KR)

( * ) Notice: Subject to any disclaimer, the term of this patent is extended or adjusted under 35 U.S.C. 154(b) by 0 days.

(21) Appl. No.: 13/949,848

(22) Filed: Jul. 24, 2013

(65) Prior Publication Data

US 2014/0124754 A1  May 8, 2014

(30) Foreign Application Priority Data

Nov. 2, 2012 (KR) .................. 10-2012-0123654

(51) Int. Cl.
*H01L 51/52* (2006.01)
*G09G 3/32* (2006.01)

(52) U.S. Cl.
CPC ............... *G09G 3/32* (2013.01); *G09G 3/3233* (2013.01); *G09G 2300/0426* (2013.01); *G09G 2300/0819* (2013.01); *G09G 2300/0842* (2013.01); *G09G 2300/0861* (2013.01); *H01L 2251/568* (2013.01)

(58) Field of Classification Search
None
See application file for complete search history.

(56) References Cited

U.S. PATENT DOCUMENTS

| | | | |
|---|---|---|---|
| 8,183,069 B2 | 5/2012 | Jung | |
| 2007/0242016 A1* | 10/2007 | Choi | 345/92 |
| 2007/0296672 A1 | 12/2007 | Kim et al. | |
| 2011/0025659 A1* | 2/2011 | Kwak et al. | 345/205 |
| 2012/0249615 A1* | 10/2012 | Lee | 345/691 |

FOREIGN PATENT DOCUMENTS

| | | |
|---|---|---|
| JP | 4274151 B2 | 3/2009 |
| KR | 10-2010-0049385 A | 5/2010 |
| KR | 10-2011-0127254 A | 11/2011 |

* cited by examiner

*Primary Examiner* — Khaja Ahmad
(74) *Attorney, Agent, or Firm* — Robert E. Bushnell, Esq.

(57) ABSTRACT

An organic light emitting diode display according to the present invention includes a substrate and a plurality of pixels formed on the substrate. One pixel includes: a scan line formed on the substrate and transmitting a scan signal; a data line and a driving voltage line crossing the scan line and transmitting a data signal and a driving voltage, respectively; a switching thin film transistor connected to the scan line and the data line; a driving thin film transistor connected to a switching drain electrode of the switching thin film transistor; and an organic light emitting diode connected to a driving drain electrode of the driving thin film transistor. The plurality of pixels includes a separation pixel at which the driving voltage line is separated and a connection pixel at which the driving voltage line is connected.

14 Claims, 8 Drawing Sheets

ORGANIC LIGHT EMITTING DIODE DISPLAY

CLAIM OF PRIORITY

This application makes reference to, incorporates the same herein, and claims all benefits accruing under 35 U.S.C. §119 from an application earlier filed in the Korean Intellectual Property Office filed on 2 Nov. 2012 and there duly assigned Serial No. 10-2012-0123654.

BACKGROUND OF THE INVENTION

1. Field of the Invention

The present invention relates generally to an organic light emitting diode (OLED) display.

2. Description of the Related Art

An organic light emitting diode (OLED) display includes two electrodes and an organic emission layer disposed therebetween, electrons injected from one electrode and holes injected from the other electrode are coupled with each other on the organic emission layer to form excitons, and the excitons emit light while emitting energy.

The organic light emitting diode display includes a plurality of pixels including an organic light emitting diode as a self-light emitting element, and each pixel includes a scan line, a data line, a driving voltage line, a plurality of thin film transistors driving the organic light emitting diode, and a capacitor. The plurality of thin film transistors basically includes a switching thin film transistor and a driving thin film transistor. The driving thin film transistor and the capacitor receive an applied driving voltage ELVDD from the driving voltage line, and the driving thin film transistor controls a current flowing from the driving voltage line to the organic light emitting diode.

In general, the driving voltage line and the data line are formed with the same layer and in the same direction so as to be separated from each other so that an interval between the driving voltage line and the data line is very narrow in a high resolution organic light emitting diode display of more than 250 ppi.

Also, in the high resolution organic light emitting diode display, since a size of the pixel is decreased as a relative area occupied by the driving voltage line and the data line is increased in the pixel, an overlapping area between the driving voltage line and the pixel electrode is increased. Accordingly, a defect ratio such as a short due to overlying foreign materials is increased.

Furthermore, since the interval between the driving voltage line and the data line is very narrow, the short therebetween may be easily generated, and a success ratio of laser repair is deteriorated.

The above information disclosed in this Background section is only for enhancement of an understanding of the background of the described technology, and therefore it may contain information that does not form the prior art that is already known in this country to a person of ordinary skill in the art.

SUMMARY OF THE INVENTION

The present invention relates generally to an organic light emitting diode (OLED) display which increases the success ratio of laser repair, and which reduces a short due to overlying foreign materials while a short between a driving voltage line and a data line is not easily generated in high resolution.

An organic light emitting diode display according to an exemplary embodiment includes a substrate and a plurality of pixels formed on the substrate, wherein one pixel includes: a scan line formed on the substrate and transmitting a scan signal; a data line and a driving voltage line crossing the scan line and respectively transmitting a data signal and a driving voltage; a switching thin film transistor connected to the scan line and the data line; a driving thin film transistor connected to a switching drain electrode of the switching thin film transistor; and an organic light emitting diode connected to a driving drain electrode of the driving thin film transistor, The plurality of pixels includes a separation pixel at which the driving voltage line is separated and a connection pixel to which the driving voltage line is connected.

The separation pixel and the connection pixel may be alternately disposed.

The separation pixel may be disposed so as to be close to the connection pixel in a row direction.

The separation pixel may be disposed so as to be close to the connection pixel in a column direction.

A separation pixel array including the separation pixel and a connection pixel array including the connection pixel may be alternately disposed.

The organic light emitting diode display may further include: a first gate insulating layer formed on the substrate; and a storage capacitor including a first storage capacitor plate formed on the first gate insulating layer, a second gate insulating layer covering the first storage capacitor plate, and a second storage capacitor plate formed on the second gate insulating layer and overlapping the first storage capacitor plate. The driving voltage line may be connected to the second storage capacitor plate.

The driving voltage line may include a separation driving voltage line formed in the separation pixel and a connection driving voltage line formed in the connection pixel.

The separation driving voltage line and the connection driving voltage line may be connected to each other through the second storage capacitor plate.

The organic light emitting diode display may further include a compensation thin film transistor that is turned on by the scan signal so as to compensate a threshold voltage of the driving thin film transistor, and that is connected to the driving thin film transistor, and an initialization thin film transistor that is turned on according to a previous scan signal transmitted through a previous scan line separated from the scan line, and that transmits an initialization voltage transmitted through an initialization voltage line close to the previous scan line to the driving gate electrode of the driving thin film transistor. The separation driving voltage line may not cross the initialization voltage line and the previous scan line.

The separation driving voltage line may include one separation terminal positioned at one side with reference to the initialization voltage line and the previous scan line, and another separation terminal positioned at the other side with reference to the initialization voltage line and the previous scan line.

The organic light emitting diode display may further include an interlayer insulating layer covering the second storage capacitor plate, a connection member formed on the interlayer insulating layer and connected to the driving gate electrode through a contact hole formed in the interlayer insulating layer, and a protective layer covering the interlayer insulating layer and the connection member, The connection member is connected to a compensation drain electrode of the compensation thin film transistor, and the other separation terminal of the separation driving voltage line is connected to the second storage capacitor plate through a contact hole formed in the interlayer insulating layer.

The organic light emitting diode display may further include an operation control thin film transistor that is turned on by the light emission control signal transmitted by the light emission control line separated from the scan line, and that transmits the driving voltage to the driving thin film transistor, and one separation terminal of the separation driving voltage line may be connected to the operation control source electrode of the operation control thin film transistor through a contact hole formed in the interlayer insulating layer.

The scan line may be formed with the same layer as the second storage capacitor plate, and the data line and driving voltage line may be formed with the same layer as the connection member.

The initialization voltage line may be formed with the same layer as the scan line, and the previous scan line may be formed with the same layer as the light emission control line.

According to the present invention, by forming the partial pixel among a plurality of pixels into the separation pixel in which the driving voltage line is separated in the pixel, the area where the driving voltage line is close to the data line is reduced such that the short between the driving voltage line and the data line is minimized and sufficient laser repair space is obtained, thereby increasing the success ratio of the laser repair.

Also, in the case of the separation pixel, the portion of the driving voltage line is not formed such that the overlapping area of the driving voltage line and the pixel electrode is decreased so that the short due to the overlying foreign materials may be minimized.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

Figure 1:
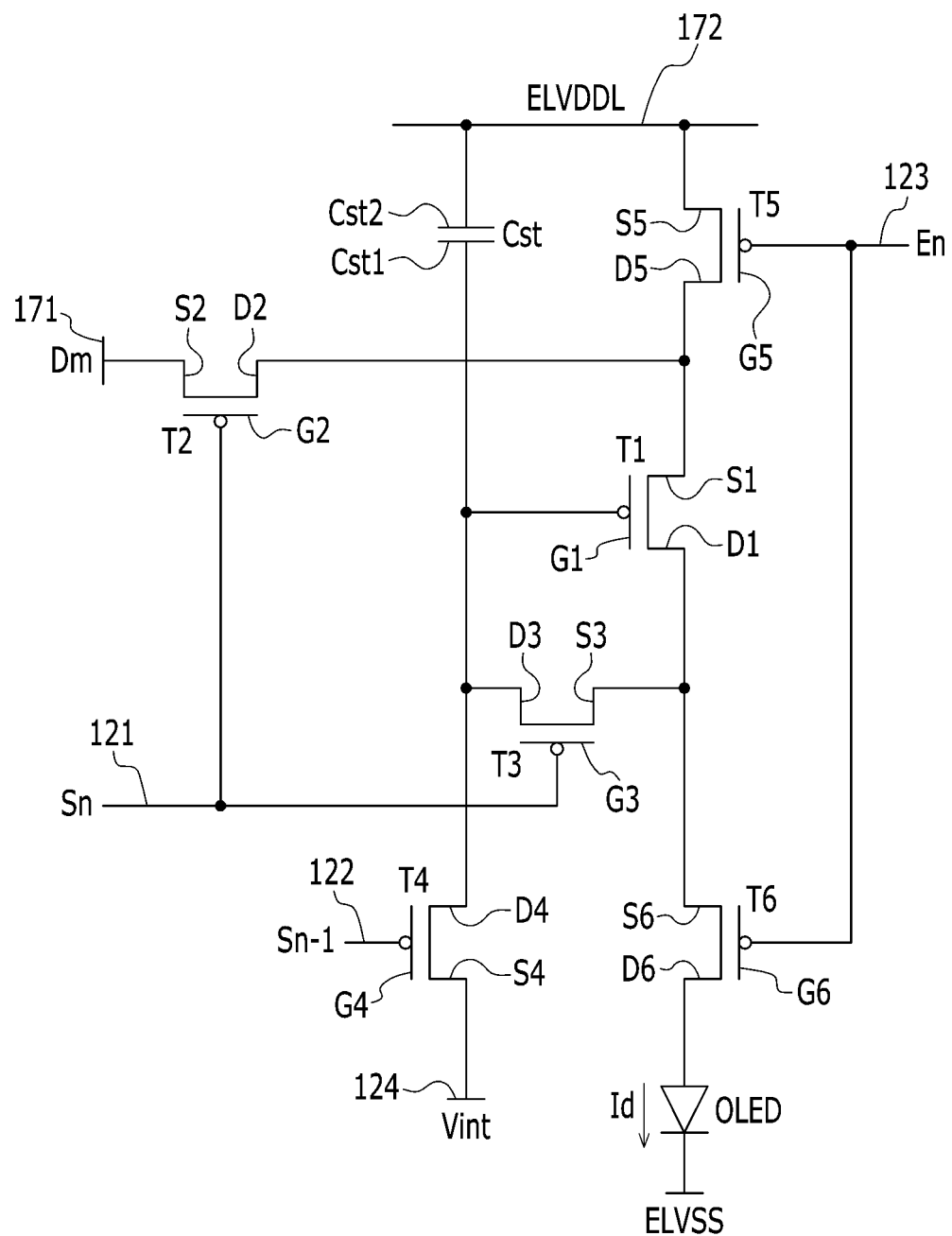
FIG. 1 is an equivalent circuit of one pixel of an organic light emitting diode (OLED) display according to a first exemplary embodiment of the invention.

The present invention will be described more fully hereinafter with reference to the accompanying drawings, in which exemplary embodiments of the invention are shown. As those skilled in the art will realize, the described embodiments may be modified in various different ways, all without departing from the spirit or scope of the present invention.

In order to clarify the present invention, parts that are not connected with the description will be omitted, and the same elements or equivalents are referred to by the same reference numerals throughout the specification.

Furthermore, as the size and thickness of the respective structural components shown in the drawings are arbitrarily illustrated for explanatory convenience, the present invention is not necessarily limited to the size and thickness as illustrated.

In the drawings, the thickness of layers, films, panels, regions, etc. are exaggerated for clarity. In the drawings, for better understanding and ease of description, the thicknesses of some layers and areas are exaggerated. It will be understood that, when an element such as a layer, film, region, or substrate is referred to as being "on" another element, it can be directly on the other element or intervening elements may also be present.

In addition, unless explicitly described to the contrary, the word "comprise" and variations such as "comprises" or "comprising" will be understood to imply the inclusion of stated elements but not the exclusion of any other elements. In addition, "on" indicates that n element is either positioned on or below a portion of a target or positioned on the upper side based on a gravity direction, throughout the specification.

An organic light emitting diode (OLED) display according to the first exemplary embodiment of the invention will now be described with reference to FIG. 1 to FIG. 7.

FIG. 1 is an equivalent circuit of one pixel of an organic light emitting diode (OLED) display according to a first exemplary embodiment of the invention.

As shown in FIG. 1, one pixel of an organic light emitting diode (OLED) display according to the first exemplary embodiment includes a plurality of signal lines 121, 122, 123, 124, 171, and 172, a plurality of thin film transistors T1, T2, T3, T4, T5, and T6 connected to a plurality of signal lines, a storage capacitor Cst, and an organic light emitting diode OLED.

The thin film transistors include a driving thin film transistor T1, a switching thin film transistor T2, a compensation thin film transistor T3, an initialization thin film transistor T4, an operation control thin film transistor T5, and a light emission control thin film transistor T6.

The signal lines include a scan line 121 transmitting a scan signal Sn, a previous scan line 122 transmitting a previous scan signal Sn-1 to the initialization thin film transistor T4, a light emission control line 123 transmitting a light emission control signal En to the operation control thin film transistor T5 and the light emission control thin film transistor T6, a data line 171 crossing the scan line 121 and transmitting a data signal Dm, a driving voltage line 172 transmitting a driving voltage ELVDD and being substantially parallel to the data line 171, and an initialization voltage line 124 transmitting an initialization voltage Vint initializing the driving thin film transistor T1.

A gate electrode G1 of the driving thin film transistor T1 is connected to one terminal Cst1 of the storage capacitor Cst, a source electrode S1 of the driving thin film transistor T1 is connected to the driving voltage line 172 through the operation control thin film transistor T5, and a drain electrode D1 of the driving thin film transistor T1 is electrically connected to an anode of the organic light emitting diode OLED through the light emission control thin film transistor T6. The driving thin film transistor T1 receives the data signal Dm according to the switching operation of the switching thin film transistor T2 so as to supply a driving current Id to the organic light emitting diode OLED.

A gate electrode G2 of the switching thin film transistor T2 is connected to the scan line 121, a source electrode S2 of the switching thin film transistor T2 is connected to the data line 171, and a drain electrode D2 of the switching thin film transistor T2 is connected to the source electrode S1 of the driving thin film transistor T1 and to the driving voltage line 172 through the operation control thin film transistor T5. The switching thin film transistor T2 is turned on according to the scan signal Sn transmitted through the scan line 121, thereby performing a switching operation for transmitting the data signal Dm transmitted through the data line 171 to the source electrode of the driving thin film transistor T1.

A gate electrode G3 of the compensation thin film transistor T3 is connected to the scan line 121, a source electrode S3 of the compensation thin film transistor T3 is connected via the light emission control thin film transistor T6 to the anode of the organic light emitting diode while being connected to the drain electrode D1 of the driving thin film transistor T1, and a drain electrode D3 of the compensation thin film transistor T3 is connected to an end Cst1 of the storage capacitor Cst, to a drain electrode D4 of the initialization thin film transistor T4, and yo the gate electrode G1 of the driving thin film transistor T1 together. The compensation thin film transistor T3 is turned on according to the scan signal Sn transferred through the scan line 121 so as to connect the gate electrode G1 and the drain electrode D1 of the driving thin film transistor T1 to each other, thus performing diode-connection of the driving thin film transistor T1.

A gate electrode G4 of the initialization thin film transistor T4 is connected to the prior scan line 122, a source electrode S4 of the initialization thin film transistor T4 is connected to the initialization voltage line 124, and a drain electrode D4 of the initialization thin film transistor T4 is connected to an end Cst1 of the storage capacitor Cst, to the drain electrode D3 of the compensation thin film transistor T3, and to the gate electrode G1 of the driving thin film transistor T1 together. The initialization thin film transistor T4 is turned on according to the prior scan signal Sn-1 transferred through the prior scan line 122 so as to transfer the initialization voltage Vint to the gate electrode G1 of the driving thin film transistor T1, thus performing an initialization operation of initializing the voltage of the gate electrode G1 of the driving thin film transistor T1.

A gate electrode G5 of the operation control thin film transistor T5 is connected to the light emission control line 123, a source electrode S5 of the operation control thin film transistor T5 is connected to the driving voltage line 172, and a drain electrode D5 of the operation control thin film transistor T5 is connected to the source electrode S1 of the driving thin film transistor T1 and to the drain electrode S2 of the switching thin film transistor T2.

A gate electrode G6 of the light emission control thin film transistor T6 is connected to the light emission control line 123, a source electrode S6 of the light emission control thin film transistor T6 is connected to the drain electrode D1 of the driving thin film transistor T1 and to the source electrode S3 of the compensation thin film transistor T3, and a drain electrode D6 of the light emission control thin film transistor T6 is electrically connected to the anode of the organic light emitting diode OLED. The operation control thin film transistor T5 and the light emission control thin film transistor T6 are simultaneously turned on according to the light emission control signal En transferred through the light emission control line 123 so as to transfer the driving voltage ELVDD to the organic light emitting diode OLED, thus allowing the driving current Id to flow in the organic light emitting diode OLED.

The other end Cst2 of the storage capacitor Cst is connected to the driving voltage line 172, and a cathode of the organic light emitting diode OLED is connected to a common voltage ELVSS. Accordingly, the organic light emitting diode OLED receives a driving current Id from the driving thin film transistor T1 to emit light, thereby displaying an image.

Hereinafter, a specific operational process of one pixel of the organic light emitting diode display according to the first exemplary embodiment will be described in detail.

First, a prior scan signal Sn-1 of a low level is supplied through the prior scan line 122 during an initialization period. Then, the initialization thin film transistor T4 is turned on in correspondence to the prior scan signal Sn-1 of the low level, and the initialization voltage Vint is connected from the initialization voltage line 124 through the initialization thin film transistor T4 to the gate electrode of the driving thin film transistor T1 so as to initialize the driving thin film transistor T1 by the initialization voltage Vint.

Subsequently, the scan signal Sn of the low level is supplied through the scan line 121 during a data programming period. Then, the switching thin film transistor T2 and the compensation thin film transistor T3 are turned on in correspondence to the scan signal Sn of the low level.

In this case, the driving thin film transistor T1 is diode-connected by the turned-on compensation thin film transistor T3, and is biased in a forward direction.

Then, a compensation voltage Dm+Vth (Vth is a negative value) obtained by subtracting the threshold voltage Vth of the driving thin film transistor T1 from the data signal Dm supplied from the data line 171 is applied to the gate electrode of the driving thin film transistor T1.

The driving voltage ELVDD and the compensation voltage Dm+Vth are applied to respective ends of the storage capacitor Cst, and a charge corresponding to a difference between voltages at both ends is stored in the storage capacitor Cst. Subsequently, the level of the light emission control signal En supplied from the light emission control line 123 during the light emission period is changed from the high level to the low level. Then, the operation control thin film transistor T5 and the light emission control thin film transistor T6 are turned on by the light emission control signal En of the low level during the light emission period.

Then, the driving current Id is generated according to a difference between the voltage of the gate electrode of the driving thin film transistor T1 and the driving voltage ELVDD, and the driving current Id is supplied through the light emission control thin film transistor T6 to the organic light emitting diode OLED. The gate-source voltage Vgs of the driving thin film transistor T1 is maintained at '(Dm+Vth)−ELVDD' by the storage capacitor Cst during the light emission period, and the driving current Id is proportional to the square of a value obtained by subtracting the threshold voltage from the source-gate voltage, that is, '(Dm−ELVDD)$^2$' according to a current-voltage relationship of the driving thin film transistor T1. Accordingly, the driving current Id is determined regardless of the threshold voltage Vth of the driving thin film transistor T1.

Now, a detailed structure of the pixel of the organic light emitting diode display shown in FIG. 1 will be described in detail with reference to FIG. 2 to FIG. 7 together with FIG. 1.

Figure 2:
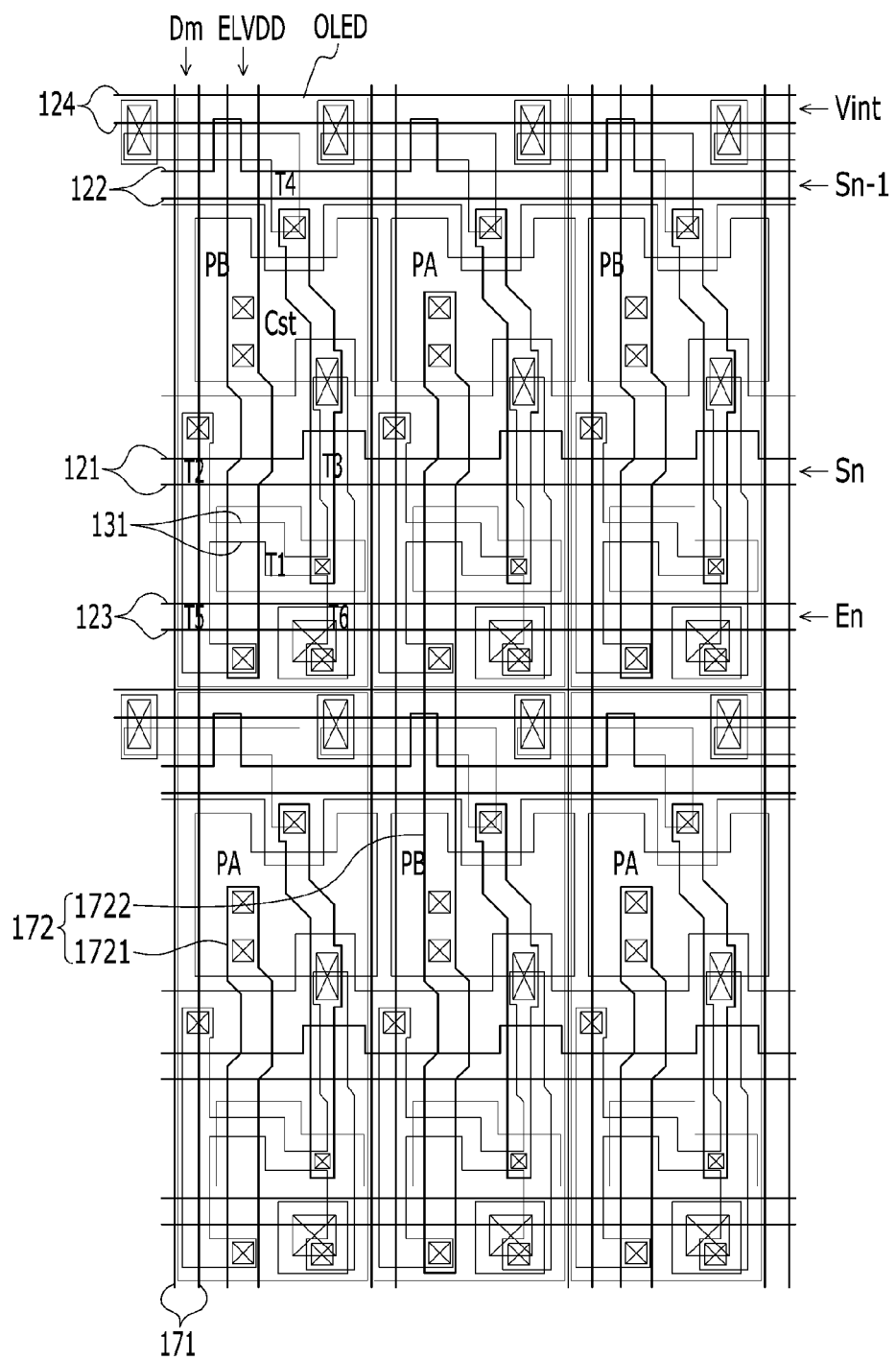
FIG. 2 is a layout view of six pixels of an organic light emitting diode (OLED) display according to the first exemplary embodiment of the invention, schematically showing a position of a separation pixel and a connection pixel.
Figure 3:
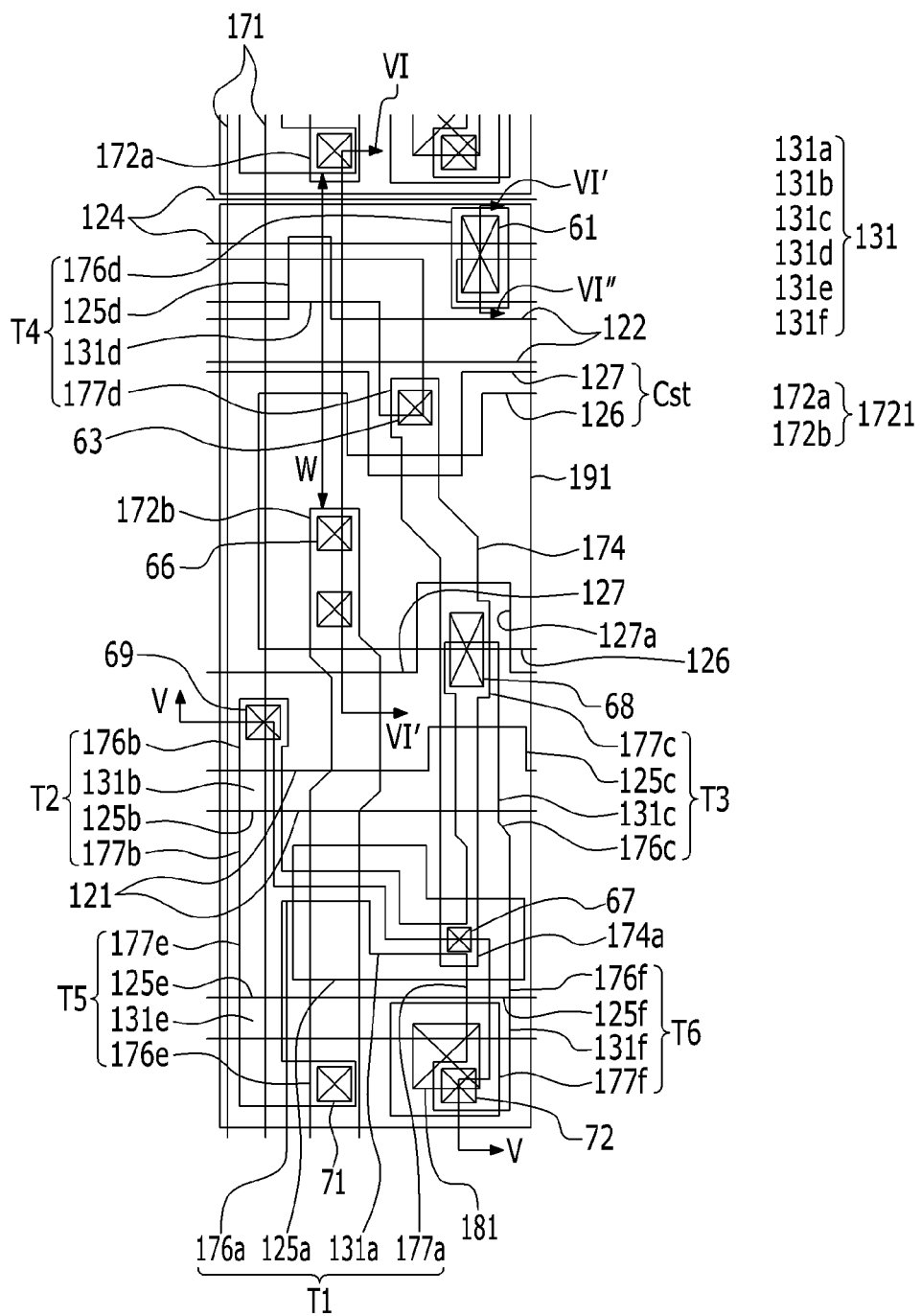
FIG. 3 is a detailed layout view of a separation pixel of an organic light emitting diode (OLED) display according to the first exemplary embodiment of the invention.
Figure 4:
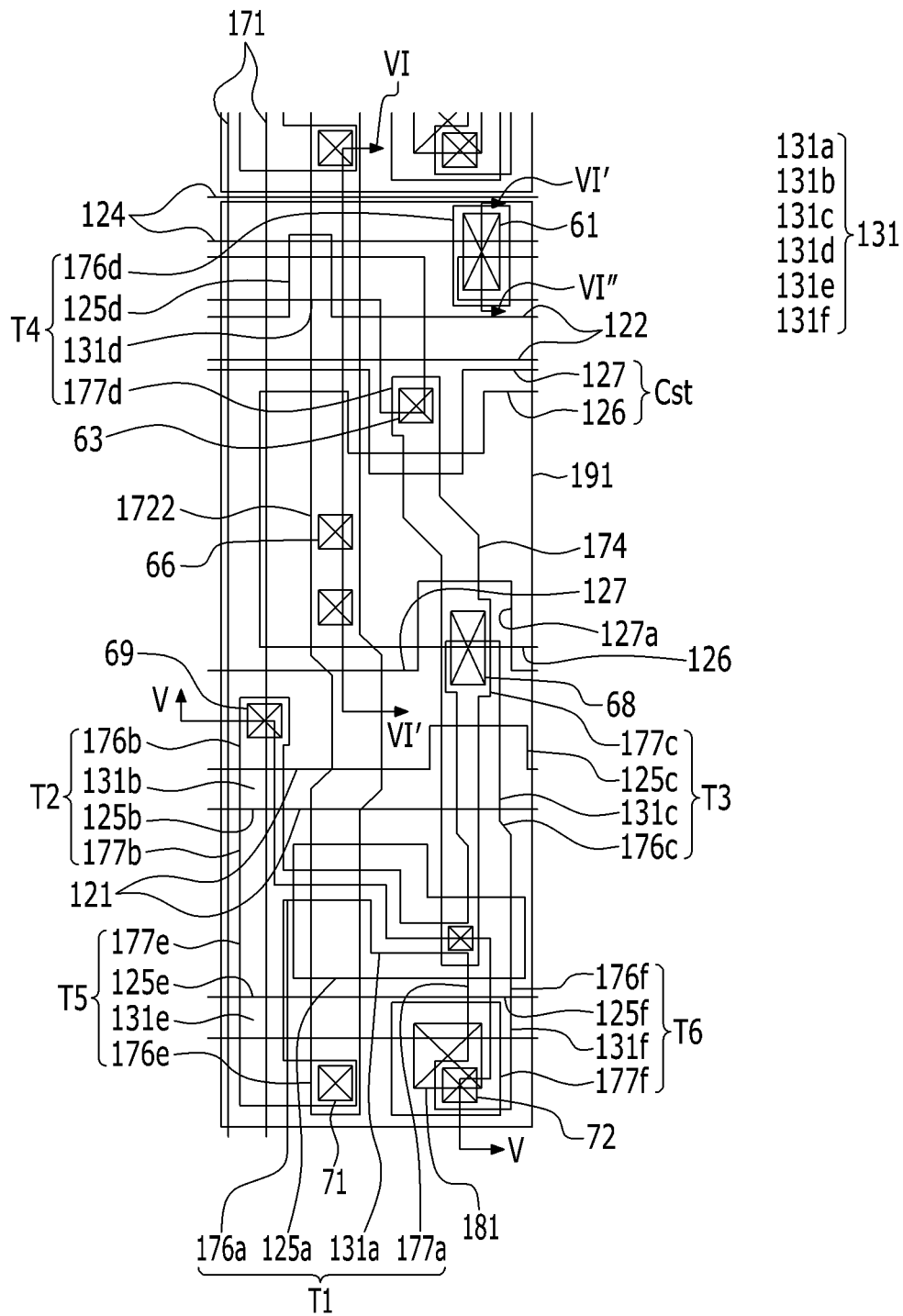
FIG. 4 is a detailed layout view of a connection pixel of an organic light emitting diode (OLED) display according to the first exemplary embodiment of the invention.
Figure 5:
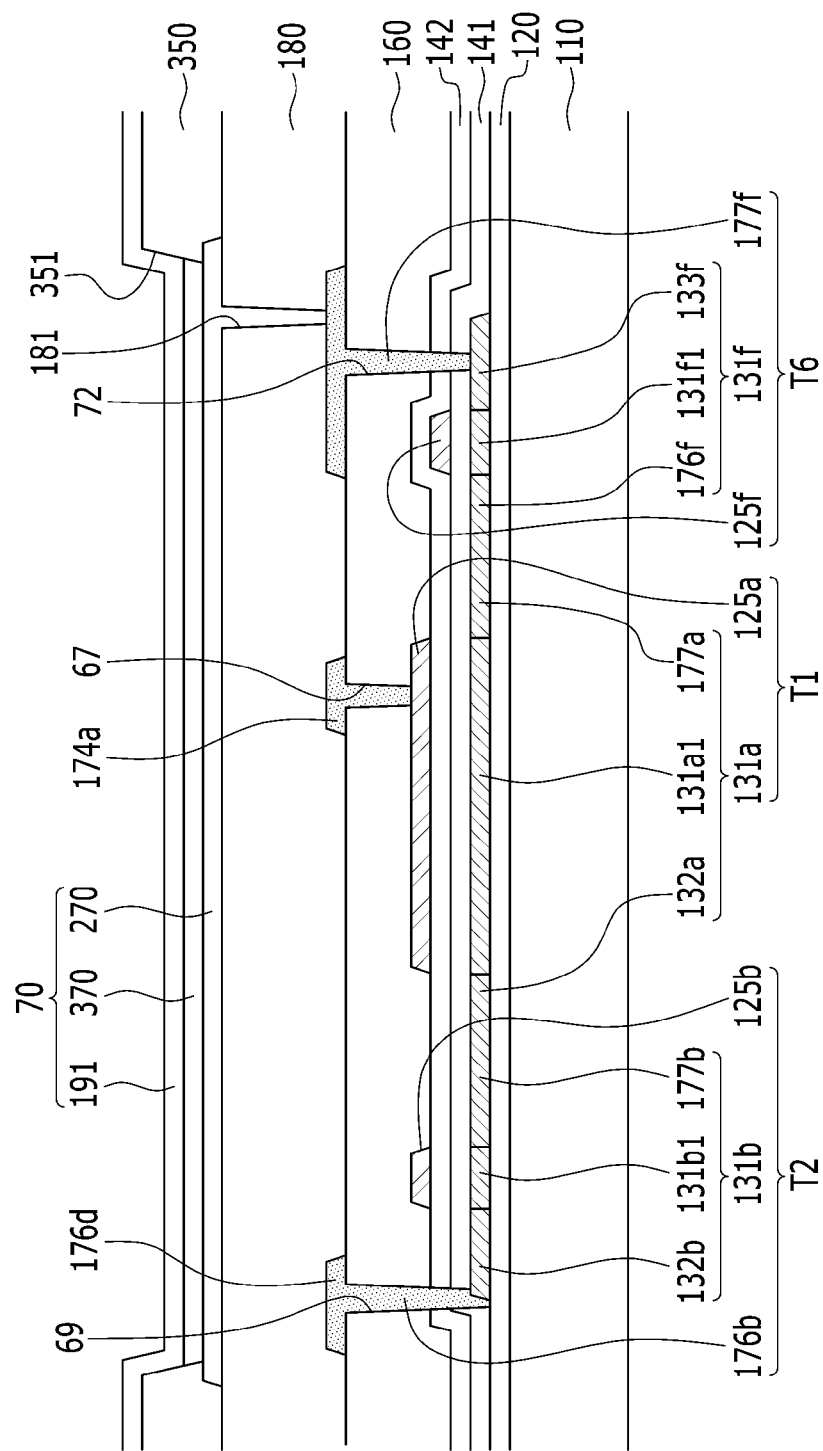
FIG. 5 is a cross-sectional view of the separation pixel of FIG. 3 taken along the line V-V.
Figure 6:
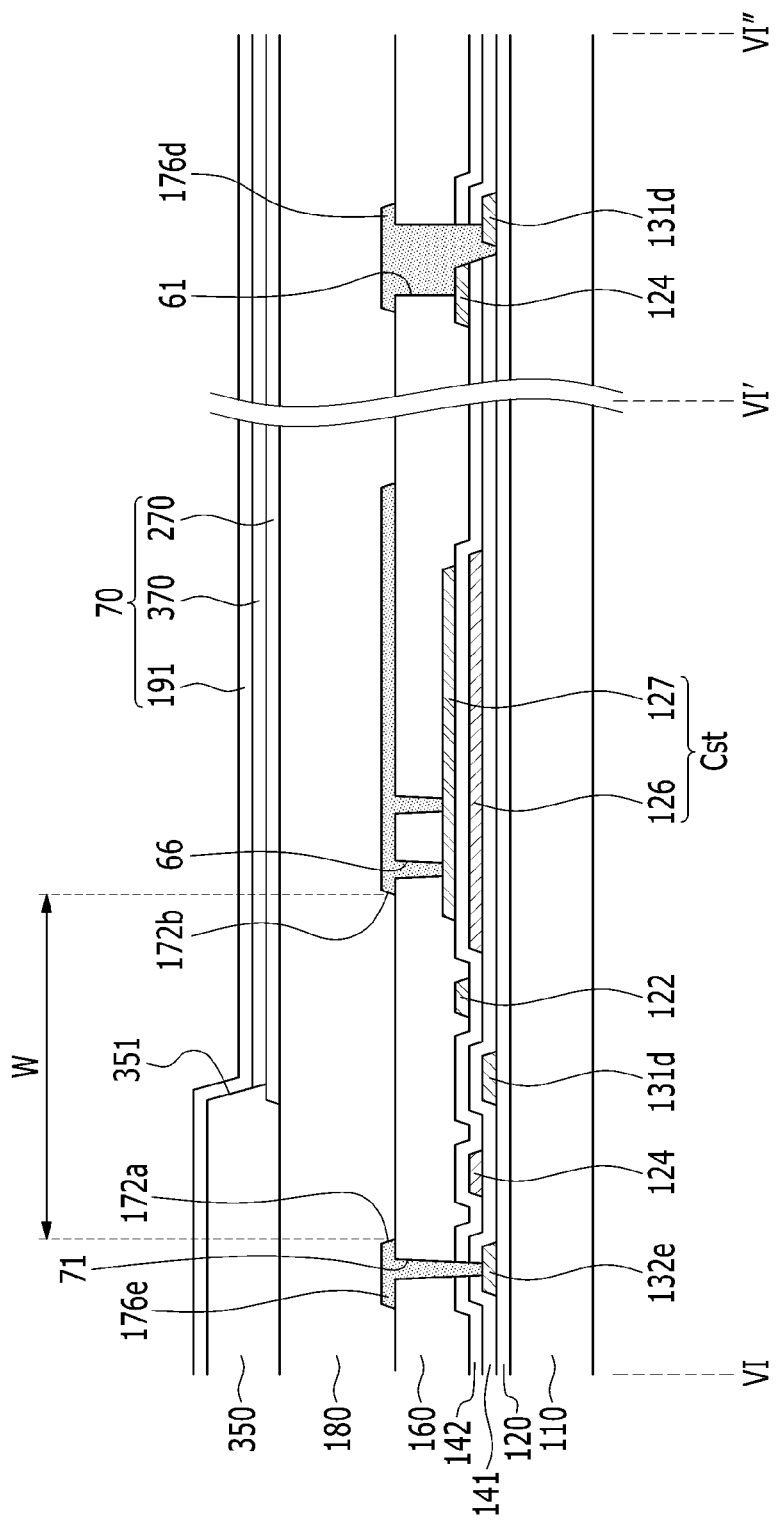
FIG. 6 is a cross-sectional view of the separation pixel of FIG. 3 taken along the lines VI-VI' and VI'-VI".
Figure 7:
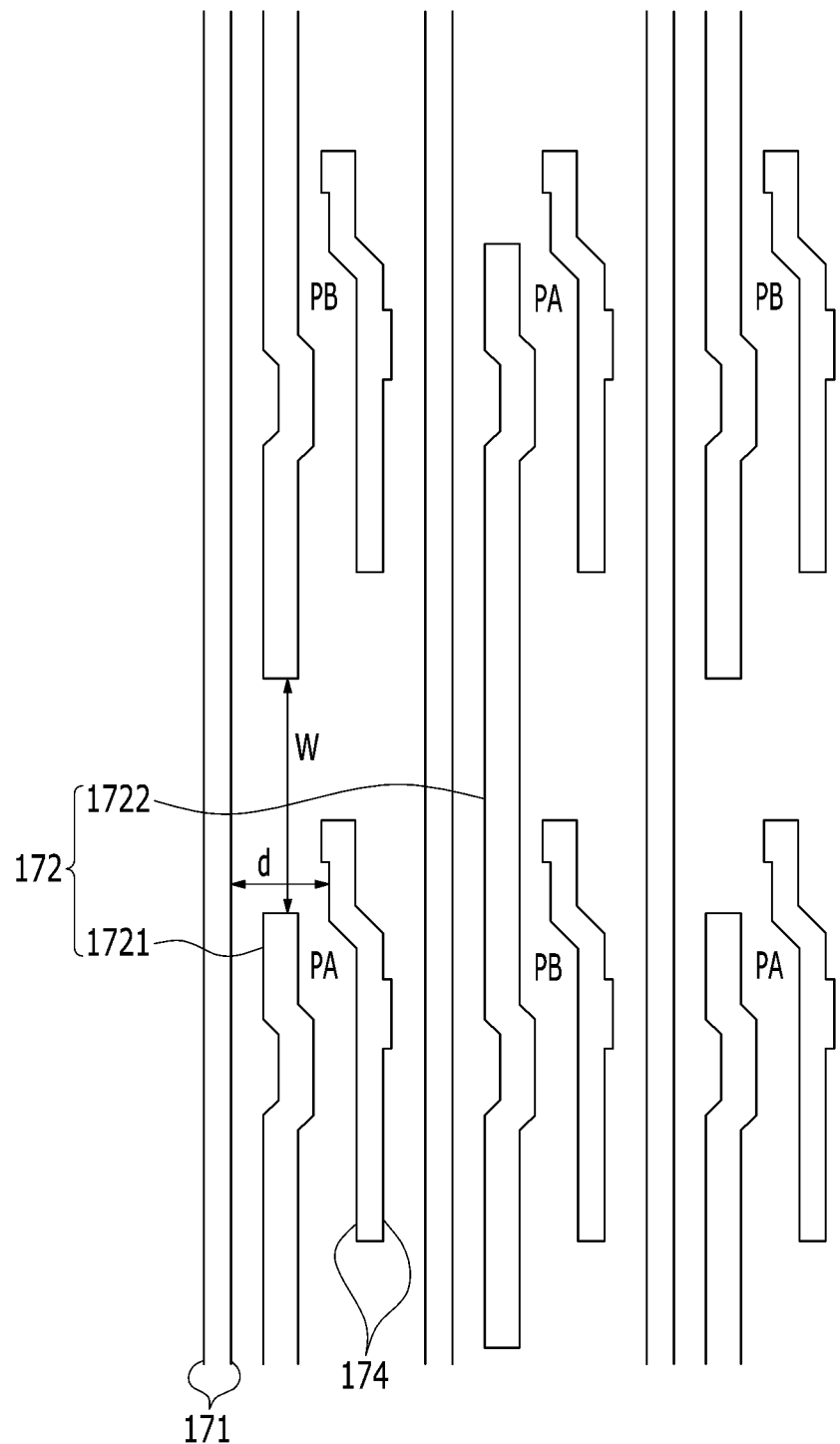
FIG. 7 is a layout view of a driving voltage line and a data line of six pixels of an organic light emitting diode (OLED) display according to the first exemplary embodiment of the invention.

FIG. 2 is a layout view of six pixels of an organic light emitting diode (OLED) display according to the first exemplary embodiment of the invention, schematically showing a position of a separation pixel and a connection pixel, FIG. 3 is a detailed layout view of a separation pixel of an organic light emitting diode (OLED) display according to the first exemplary embodiment of the invention, FIG. 4 is a detailed layout view of a connection pixel of an organic light emitting diode (OLED) display according to the first exemplary embodiment of the invention, FIG. 5 is a cross-sectional view of the separation pixel of FIG. 3 taken along the line V-V, FIG. 6 is a cross-sectional view of the separation pixel of FIG. 3 taken along the lines VI-VI' and VI'-VI", and FIG. 7 is a layout view of a driving voltage line and a data line of six pixels of an organic light emitting diode (OLED) display according to the first exemplary embodiment of the invention.

As shown in FIG. 2, the organic light emitting diode display according to the first exemplary embodiment includes a plurality of pixels, and each pixel is used as one pixel of a red pixel (R), a green pixel (G), and a blue pixel (B), and a color is realized by a combination thereof.

One pixel includes the scan line 121, the prior scan line 122, the light emission control line 123, and the initialization voltage line 124 applying the scan signal Sn, the prior scan signal Sn-1, the light emission control signal En, and the initialization voltage Vint, respectively, and formed in a row direction, and the data line 171 and the driving voltage line 172 cross the scan line 121, the prior scan line 122, the light emission control line 123, and the initialization voltage line 124 and apply the data signal Dm and the driving voltage ELVDD, respectively, to the pixel.

Furthermore, in the pixel, the driving thin film transistor T1, the switching thin film transistor T2, the compensation thin film transistor T3, the initialization thin film transistor T4, the operation control thin film transistor T5, the light emission control thin film transistor T6, the storage capacitor Cst, and the organic light emitting diode 70 are formed.

The driving thin film transistor T1, the switching thin film transistor T2, the compensation thin film transistor T3, the initialization thin film transistor T4, the operation control thin film transistor T5, and the light emission control thin film transistor T6 are formed along the semiconductor layer 131, and the semiconductor layer 131 is bent to have various shapes. The semiconductor layer 131 may be made of polysilicon or an oxide semiconductor. The oxide semiconductor may include an oxide based on titanium (Ti), hafnium (Hf), zirconium (Zr), aluminum (Al), tantalum (Ta), germanium (Ge), zinc (Zn), gallium (Ga), tin (Sn) or indium (In), and as a composite oxide thereof, one of zinc oxide (ZnO), indium-gallium-zinc oxide (InGaZnO4), zinc-indium oxide (Zn—In—O), zinc-tin oxide (Zn—Sn—O) indium-gallium oxide (In—Ga—O), indium-tin oxide (In—Sn—O), indium-zirconium oxide (In—Zr—O), indium-zirconium-zinc oxide (In—Zr—Zn—O), indium-zirconium-tin oxide (In—Zr—Sn—O), indium-zirconium-gallium oxide (In—Zr—Ga—O), indium-aluminum oxide (In—Al—O), indium-zinc-aluminum oxide (In—Zn—Al—O), indium-tin-aluminum oxide (In—Sn—Al—O), indium-aluminum-gallium oxide (In—Al—Ga—O), indium-tantalum oxide (In—Ta—O), indium-tantalum-zinc oxide (In—Ta—Zn—O), indium-tantalum-tin oxide (In—Ta—Sn—O), indium-tantalum-gallium oxide (In—Ta—Ga—O), indium-germanium oxide (In—Ge—O), indium-germanium-zinc oxide (In—Ge—Zn—O), indium-germanium-tin oxide (In—Ge—Sn—O), indium-germanium-gallium oxide (In—Ge—Ga—O), titanium-indium-zinc oxide (Ti—In—Zn—O), hafnium-indium-zinc oxide (Hf—In—Zn—O) may be used. When the semiconductor layer 131 is made of an oxide semiconductor, an additional protection layer may be added in order to protect the oxide semiconductor that is vulnerable to external environment factors, such as high temperature. The semiconductor layer 131 includes a channel region not doped with an impurity and a source region and a drain region formed at both sides of the channel region so as to be doped with an impurity. Herein, the impurity is changed according to the kind of thin film transistor, and an N type impurity or a P type impurity may be applied.

As shown in FIG. 2 to FIG. 4, the driving voltage line 172 includes a separation driving voltage line 1721 that is separated in the pixel and a connection driving voltage line 1722 that is connected in the pixel. The plurality of pixels includes a separation pixel PA where the separation driving voltage line 1721 is formed and a connection pixel PB where the connection driving voltage line 1722 is formed. The separation pixel PA and the connection pixel PB are offset so as to be disposed in a zigzag pattern. That is, the separation pixel PA is disposed close to the connection pixel PB in a row direction and the separation pixel PA is disposed close to the connection pixel PB in a column direction. Accordingly, one separation pixel PA is enclosed by four connection pixels PB, and one connection pixel PB is enclosed by four separation pixels PA.

In the pixel for the separation pixel PA, the area where the separation driving voltage line and the data line are close to each other is minimized, and accordingly, the short between the driving voltage line and the data line is minimized.

Also, in the case of the separation pixel PA, the separation driving voltage line is formed such that the overlapping area between the driving voltage line and the pixel electrode is reduced, thereby reducing a defect ratio such as a short due to overlying foreign materials.

A planar structure of the separation pixel and the connection pixel of the organic light emitting diode display according to the first exemplary embodiment will be firstly described with reference to FIG. 2 and FIG. 4, and then a deposition structure of the separation pixel and connection pixel will be described with reference to FIG. 5 and FIG. 6. In this case, a common pixel structure of the separation pixel and the connection pixel will be described together, and differences between the separation pixel and the connection pixel will be separately described.

Firstly, as shown in FIG. 2 to FIG. 4, the pixel of the organic light emitting diode display according to the first exemplary embodiment includes a driving thin film transistor T1, a switching thin film transistor T2, a compensation thin film transistor T3, an initialization thin film transistor T4, an operation control thin film transistor T5, a light emission control thin film transistor T6, a storage capacitor Cst, and an organic light emitting diode OLED. The thin film transistors T1, T2, T3, T4, T5, and T6 are formed according to the semiconductor layers 131, and the semiconductor layers 131 include a driving semiconductor layer 131a formed in the driving thin film transistor T1, a switching semiconductor layer 131b formed in the switching thin film transistor T2, a compensation semiconductor layer 131c formed in the compensation thin film transistor T3, an initialization semiconductor layer 131d formed in the initialization thin film transistor T4, an operation control semiconductor layer 131e formed in the operation control thin film transistor T5, and a light emission control semiconductor layer 131f formed in the light emission control thin film transistor T6.

The driving thin film transistor T1 includes the driving semiconductor layer 131a, a driving gate electrode 125a, a driving source electrode 176a, and a driving drain electrode 177a. The driving source electrode 176a corresponds to a driving source region 176a doped with an impurity in the driving semiconductor layer 131a, and the driving drain electrode 177a corresponds to driving drain region 177a doped with an impurity in the driving semiconductor layer 131a. The driving gate electrode 125a overlaps the driving semiconductor layer 131a and has a wider area than the driving semiconductor layer 131a.

The driving gate electrode 125a is formed with the same material and the same layer as the scan line 121, the initialization voltage line 124, a switching gate electrode 125b, a compensation gate electrode 125c, and a second storage capacitor plate 127.

The switching thin film transistor T2 includes the switching semiconductor layer 131b, the switching gate electrode 125b, a switching source electrode 176b, and a switching drain electrode 177b. The switching source electrode 176b is a portion protruding from the data line 171, and the switching drain electrode 177b corresponds to the switching drain region 177b doped with an impurity in the switching semiconductor layer 131b.

The compensation thin film transistor T3 includes the compensation semiconductor layer 131c, the compensation gate electrode 125c, a compensation source electrode 176c, and a compensation drain electrode 177c, and the compensation source electrode 176c corresponds to a compensation source region 176c doped with an impurity in the compensation semiconductor layer 131c.

The initialization thin film transistor T4 includes the initialization semiconductor layer 131d, an initialization gate electrode 125d, an initialization source electrode 176d, and an initialization drain electrode 177d. One terminal of the initialization source electrode 176d is connected to the initialization voltage line 124 through a contact hole 61 formed in an interlayer insulating layer 160, the other terminal of the initialization source electrode 176d is connected to the initialization semiconductor layer 131d through a contact hole 69 formed in a first gate insulating layer 141, a second gate insulating layer 142, and the interlayer insulating layer 160, and the initialization drain electrode 177d as the other terminal of a connection member 174 is connected to the initialization semiconductor layer 131d through a contact hole 63 formed in the first gate insulating layer 141, the second gate insulating layer 142, and the interlayer insulating layer 160.

The operation control thin film transistor T5 includes the operation control semiconductor layer 131e, an operation control gate electrode 125e, an operation control source electrode 176e, and an operation control drain electrode 177e. The operation control source electrode 176e, as a portion of the driving voltage line 172, is connected to an operation control source region 132e through a contact hole 71, and the operation control drain electrode 177e corresponds to the operation control drain region 177e doped with the impurity in the operation control semiconductor layer 131e.

The light emission control thin film transistor T6 includes the light emission control semiconductor layer 131f, a light emission control gate electrode 125f, a light emission control source electrode 176f, and a light emission control drain electrode 177f. The light emission control source electrode 176f corresponds to the light emission control source region 176f doped with the impurity in the light emission control semiconductor layer 131f.

One terminal of the driving semiconductor layer 131a of the driving thin film transistor T1 is connected to the switching semiconductor layer 131b and the operation control semiconductor layer 131e, and the other terminal of the driving semiconductor layer 131a is connected to the compensation semiconductor layer 131c and the light emission control semiconductor layer 131f. Accordingly, the driving source electrode 176a is connected to the switching drain electrode 177b and the operation control drain electrode 177e, and the driving drain electrode 177a is connected to the compensation source electrode 176c and the light emission control source electrode 176f.

The storage capacitor Cst includes a first storage capacitor plate 126 and the second storage capacitor plate 127 disposed via the second gate insulating layer 142 therebetween. Here, the second gate insulating layer 142 is composed of a dielectric material, and a storage capacitance is determined by the charge charged in the storage capacitor Cst and the voltage between both capacitor plates 126 and 127.

The first storage capacitor plate 126 is formed with the same layer and the same material as the previous scan line 122, the light emission control line 123, the operation control gate electrode 125e, and the light emission control gate electrode 125f, and the second storage capacitor plate 127 is formed with the same layer and the same material as the scan line 121, the initialization voltage line 124, the driving gate electrode 125a, the switching gate electrode 125b, and the compensation gate electrode 125c. The first storage capacitor plate 126 and the second storage capacitor plate 127 are formed with a gate wire including at least one metal such as aluminum (Al), chromium (Cr), molybdenum (Mo), titanium (Ti), tantalum (Ta), an Al—Ni—La alloy, and an Al—Nd alloy. Accordingly, the storage capacitance may be improved compared with a structure in which one capacitor plate of the storage capacitor Cst is formed of the semiconductor layer.

As shown in FIG. 3, the separation driving voltage line 1721 formed in the separation pixel PA and overlapping and passing through the storage capacitor Cst is separated from a position where the initialization voltage line 124, the previous scan line 122, and the initialization thin film transistor T4 are formed, and the separation driving voltage line 1721 includes one separation terminal 172a positioned at one side with reference to the initialization voltage line 124 and the previous scan line 122 and another separation terminal 172b positioned at the other side with reference to the initialization voltage line 124 and the previous scan line 122. The one separation terminal 172a and the other separation terminal 172b are separated by a separation interval W. The one separation terminal 172a of the separation driving voltage line 1721 corresponds to the operation control source electrode 176e, and is connected to the operation control source region through the contact hole 71, and the other separation terminal 172b of the separation driving voltage line 1721 is connected to the second storage capacitor plate 127 through another contact hole 66 formed in the interlayer insulating layer 160.

Also, as shown in FIG. 4, the connection driving voltage line 1722 formed in the connection pixel PB and overlapping and passing through the storage capacitor Cst crosses the initialization voltage line 124, the previous scan line 122, and the initialization thin film transistor T4. A portion of the connection driving voltage line 1722 corresponds to the operation control source electrode 176e and is connected to the operation control source region through the contact hole 71, and the other portion of the connection driving voltage line 1722 is connected to the second storage capacitor plate 127 through the contact hole 66 formed in the interlayer insulating layer 160.

The connection member 174 parallel to the driving voltage line 172 is formed with the same layer. The connection member 174 is connected to the driving gate electrode 125a and the first storage capacitor plate 126. One terminal 174a of the connection member 174 is connected to the driving gate electrode 125a through a contact hole 67 formed in the interlayer insulating layer 160, and the other terminal 177d of the connection member 174 corresponds to the initialization drain electrode 177d of the initialization thin film transistor T4 and is connected to the initialization semiconductor layer 131d of the initialization thin film transistor T4 through the contact hole 63 formed in the first gate insulating layer 141, the second gate insulating layer 142, and the interlayer insulating layer 160. Also, a middle protruding portion 177c of the connection member 174 corresponds to the compensation drain electrode 177c of the compensation thin film transistor T3, and is connected to the compensation semiconductor layer 131c of the compensation thin film transistor T3 through a contact hole 68 formed in the first gate insulating layer 141, the second gate insulating layer 142, and the interlayer insulating layer 160. Furthermore, the middle protruding portion 177c of the connection member 174 is connected to the first storage capacitor plate 126 through the contact hole 68 formed in the second gate insulating layer 142 and the interlayer insulating layer 160 positioned inside a storage opening 127a.

Accordingly, the first storage capacitor plate 126 of the storage capacitor Cst is connected to the compensation semiconductor layer 125c and the initialization semiconductor layer 125d through the middle protruding portion 177c of the connection member 174 and the other terminal 177d, respectively, and is connected to the driving gate electrode 125a through the one terminal 174a of the connection member 174. Also, the second storage capacitor plate 127 of the storage capacitor Cst is connected to the driving voltage line 172 through the contact hole 66 formed in the interlayer insulating layer 160.

Accordingly, the storage capacitor Cst stores the storage capacitance corresponding to a difference between the driving voltage ELVDD transmitted through the driving voltage line 172 and the gate voltage of the driving gate electrode 125a.

Meanwhile, the switching thin film transistor T2 is used as a switch for selecting a pixel to be light-emitted. The switching gate electrode 125b is connected to the scan line 121, the switching source electrode 176b is connected to the data line 171, and the switching drain electrode 177b is connected to the driving thin film transistor T1 and the operation control thin film transistor T5. Also, the light emission control drain electrode 177f of the light emission control thin film transistor T6 is directly connected to the pixel electrode 191 of the organic light emitting diode 70 (FIG. 5) through a contact hole 181 formed in a protective layer 180.

As described above, and as shown in FIG. 7, the data line and the separation driving voltage line are not close to each other in the separation pixel PA including the separation driving voltage line, and the data line and the connection member are close to each other and have a horizontal interval d therebetween. Accordingly, by reducing the area where the driving voltage line and the data line are close to each other, a short between the driving voltage line and the data line may be minimized, and sufficient laser repair space may be obtained such that the success ratio of the laser repair may be increased.

Also, in the case of the separation pixel PA, the separation driving voltage line having a portion that is removed is formed such that the overlapping area between the separation driving voltage line and the pixel electrode is reduced, thereby minimizing the short due to the overlying foreign materials.

Hereinafter, referring to FIG. 5 and FIG. 6, a structure of the organic light emitting diode display according to the first exemplary embodiment will be described in detail according to the lamination order.

In this case, referring to FIG. 5, the structure of the thin film transistor will be described based on the driving thin film transistor T1, the switching thin film transistor T2, and the light emission control thin film transistor T6. In addition, the remaining thin film transistors T3, T4, and T5 are almost the same as the laminate structures of the driving thin film transistor T1, the switching thin film transistor T2, and the light emission control thin film transistor T6, and thus are not described in further detail.

A buffer layer 120 is formed on a substrate 110, and the substrate 110 is formed as an insulating substrate made of glass, quartz, ceramics, plastics, or the like.

The driving semiconductor layer 131a, the switching semiconductor layer 131b, and the light emission control semiconductor layer 131f are formed on the buffer layer 120. The driving semiconductor layer 131a includes a driving source region 132a and a driving drain region 177a facing each other with a driving channel region 131a1 interposed therebetween. The switching semiconductor layer 131b includes a switching source region 132b and a switching drain region 177b facing each other with a switching channel region 131b1 interposed therebetween. The light emission control semiconductor layer 131f includes a light emission control channel region 131f1, a light emission control source region 176f, and a light emission control drain region 133f.

The driving semiconductor layer 131a is curved such that it may be formed long in a narrow space. Accordingly, since the driving channel region 131a1 of the driving semiconductor layer 131a may be longitudinally formed, the driving range of the gate voltage applied to the driving gate electrode 125a is broadened.

The first gate insulating layer 141 is formed of silicon nitride (SiNx) or silicon oxide (SiO2), and is formed on the switching semiconductor layer 131a, the driving semiconductor layer 131b, and the light emission control semiconductor layer 131f.

Referring to FIGS. 1-7, previous scan line 122 of FIG. 6 including initialization gate electrode 125d of FIG. 3, the light emission control line 123 of FIG. 1 including the operation control gate electrode 125e of FIG. 3 and the light emission control gate electrode 125f of FIG. 5, and the first gate wire (122, 123, 125d, 125e, 125f, and 126) including the first storage capacitor plate 126 of FIG. 6 are formed on the first gate insulating layer 141.

The second gate insulating layer 142 is formed on the first gate wire (122, 123, 125d, 125e, 125f, and 126) and the first gate insulating layer 141. The second gate insulating layer 142 is formed of silicon nitride (SiNx) or silicon oxide (SiO2).

The driving gate electrode 125a, the scan line 121 including the switching gate electrode 125b, the compensation gate electrode 125c, and the initialization voltage line 124, and the second gate wire (125a, 125b, 125c, 121, 124, and 127) including the second storage capacitor plate 127 are formed on the second gate insulating layer 142. The second storage capacitor plate 127 has a storage opening 127a connecting the middle protruding portion 177c of the connection member 174 and the first storage capacitor plate 126.

The interlayer insulating layer 160 is formed on the second gate wire (125a, 125b, 125c, 121, 124, and 127) and the second gate insulating layer 142. The interlayer insulating layer 160, like the first gate insulating layer 141 and the second gate insulating layer 142, is made of a ceramic-based material such as silicon nitride (SiNx) or silicon oxide (SiO2).

The data wire including the data line 171 including the switching source electrode 176b, the connection member 174 including the initialization drain electrode 177d and the compensation drain electrode 177c, the light emission control drain electrode 177f, and the driving voltage line 172 including the driving control source electrode 176e is formed on the interlayer insulating layer 160.

Referring to FIGS. 6 and 7, the one separation terminal 172a and the other separation terminal 172b of the separation driving voltage line 1721 formed in the separation pixel PA within the driving voltage line 172 are separated by the separation interval W.

Also, the light emission control drain electrode 177f of FIG. 5 is connected to a light emission control drain region 133f of the light emission control semiconductor layer 131f through a contact hole 72 formed in the first gate insulating layer 141, the second gate insulating layer 142, and the interlayer insulating layer 160. Also, the middle protruding portion 177c of the connection member 174 is connected to the first storage capacitor plate 126 through the contact hole 68 formed in the second gate insulating layer 142 and the interlayer insulating layer 160, and the middle protruding portion 177c of the connection member 174 is connected to the compensation semiconductor layer 131c of the compensation thin film transistor T3 through the contact hole 68 formed in the first gate insulating layer 141, the second gate insulating layer 142, and the interlayer insulating layer 160.

The protective layer 180 covering the data wire (171, 172, 174, and 177f) is formed on the interlayer insulating layer 160, and a pixel electrode 191 is formed on the protective layer 180. The pixel electrode 191 is connected to the light emission control drain electrode 177f through the contact hole 181 formed in the protective layer 180.

A barrier rib 350 is formed on an edge of the pixel electrode 191 and the protective layer 180, and the barrier rib 350 has a barrier rib opening 351 through which the pixel electrode 191 is exposed. The barrier rib 350 may be made of a resin such as a polyacrylate and a polyimide or a silica-based inorganic material.

An organic emission layer 370 is formed on the pixel electrode 191 exposed through the barrier rib opening 351, and a common electrode 270 is formed on the organic emission layer 370. As described above, the organic light emitting diode 70 including the pixel electrode 191, the organic emission layer 370, and the common electrode 270 is formed.

Herein, the pixel electrode 191 is an anode that is a hole injection electrode, and the common electrode 270 is a cathode that is an electron injection electrode. However, the exemplary embodiment according to the present invention is not limited thereto, and the pixel electrode 191 may be the cathode and the common electrode 270 may be the anode according to the driving method of the organic light emitting diode display. Holes and electrons are injected from the pixel electrode 191 and the common electrode 270 into the organic emission layer 370, and when excitons that are combinations of the injected holes and electrons fall from an exited state to a ground state, light is emitted.

The organic emission layer 370 is formed of a low molecular weight organic material or a high molecular weight organic material such as PEDOT (poly(3,4-ethylenedioxythiophene)). Furthermore, the organic emission layer 370 may be formed of a multilayer including one or more of an emission layer, a hole injection layer HIL, a hole transport layer HTL, an electron transport layer ETL, and an electron injection layer EIL. In the case where all the layers are included, the hole injection layer HIL is disposed on the pixel electrode 191 that is the anode, and the hole transport layer HTL, the emission layer, the electron transport layer ETL, and the electron injection layer EIL are sequentially laminated thereon.

The organic emission layer 370 may include a red organic emission layer light-emitting red, a green organic emission layer light-emitting green, and a blue organic emission layer light-emitting blue, and the red organic emission layer, the green organic emission layer, and the blue organic emission layer are respectively formed in the red pixel, the green pixel, and the blue pixel thereby realizing a color image.

Also, the organic emission layer 370 may realize the color image by depositing all of the red organic emission layer, the green organic emission layer, and the blue organic emission layer in the red pixel, the green pixel, and the blue pixel, and forming a red color filter, a green color filter, and a blue color filter for each pixel. As another example, a white organic emission layer emitting white is formed in all of the red pixel, the green pixel, and the blue pixel, and the red color filter, the green color filter, and the blue color filter are formed for each pixel, thereby realizing the color image. When realizing the color image by using the white organic emission layer and the color filter, it is not necessary to use a deposition mask to deposit the red organic emission layer, the green organic emission layer, and the blue organic emission layer for each pixel, that is, the red pixel, the green pixel, and the blue pixel.

As another example, the white organic emission layer is formed of one organic emission layer, and a plurality of organic emission layers are deposited, thereby realizing the white light emission. For example, a combination of at least one yellow organic emission layer and at least one blue organic emission layer for the white light emission, a combination of at least one cyan organic emission layer and at least one red organic emission layer for the white light emission, and a combination of at least one magenta organic emission layer and at least one green organic emission layer for the white light emission are possible.

Since the common electrode 270 is formed of a reflective conductive material, a rear surface light emission type of organic light emitting diode display is obtained. A material such as lithium (Li), calcium (Ca), lithium fluoride/calcium (LiF/Ca), lithium fluoride/aluminum (LiF/Al), aluminum (Al), silver (Ag), magnesium (Mg), or gold (Au) may be used as the reflective material.

Meanwhile, in the first exemplary embodiment, the separation pixel and the connection pixel are alternately disposed with a zigzag shape, but the second exemplary embodiment, in which a separation pixel array including the separation pixels and a connection pixel array including the connection pixels are alternately disposed, is possible.

Next, an organic light emitting diode (OLED) display according to the second exemplary embodiment will be described with reference to FIG. 8.

Figure 8:
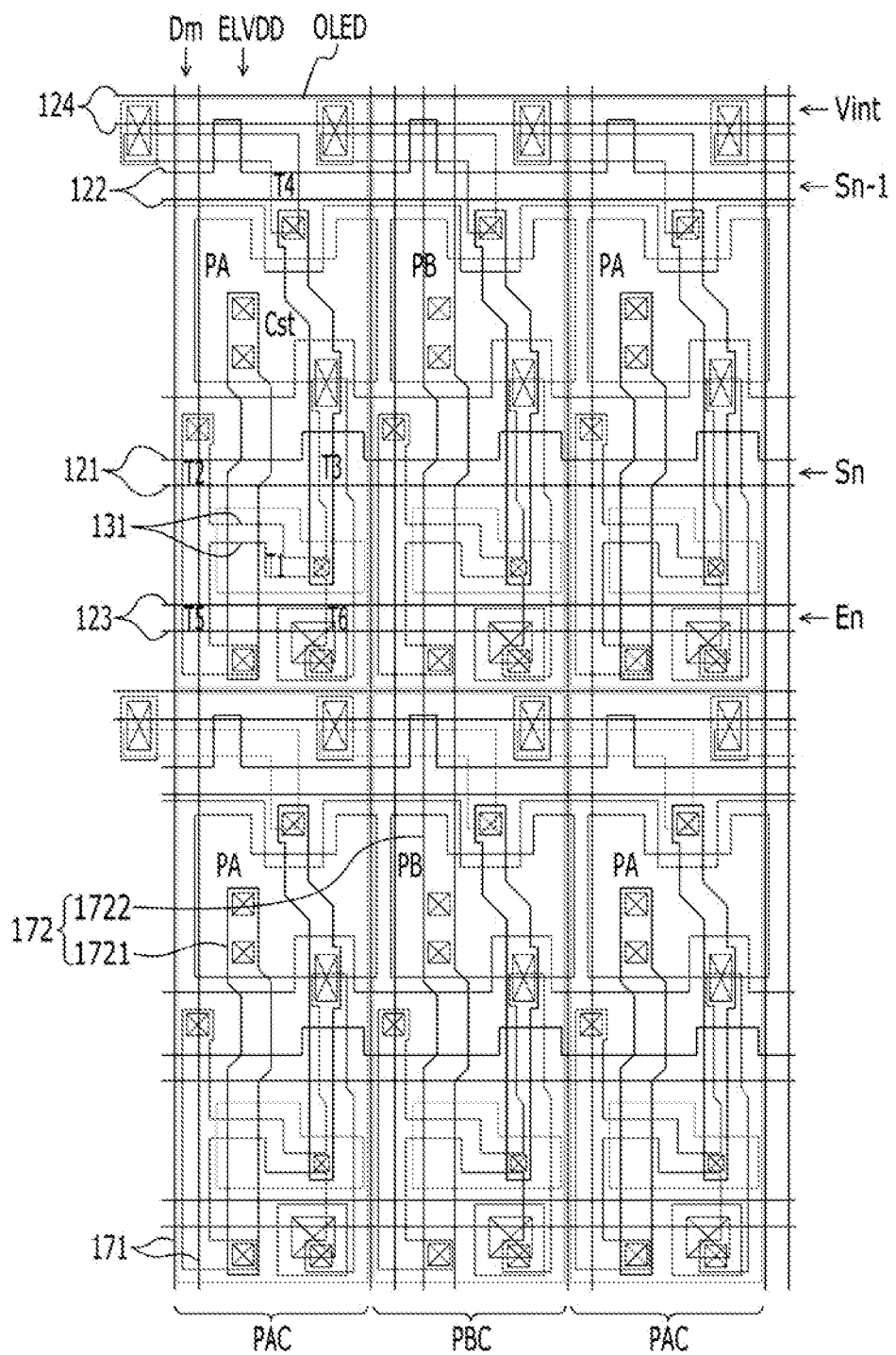
FIG. 8 is a layout view of six pixels of an organic light emitting diode (OLED) display according to a second exemplary embodiment of the invention, schematically showing a position of a separation pixel and a connection pixel.

FIG. 8 is a layout view of six pixels of an organic light emitting diode (OLED) display according to the second exemplary embodiment of the invention, schematically showing a position of a separation pixel and a connection pixel.

The second exemplary embodiment is substantially equivalent to the first exemplary embodiment shown in FIG. 1 to FIG. 7 except for the position of the separation pixel and the connection pixel such that a repeated description of common elements and features is omitted.

As shown in FIG. 8, the driving voltage line 172 of the organic light emitting diode display according to the second exemplary embodiment includes a separation driving voltage line 1721 that is separated in the pixel and a connection driving voltage line 1722 that is connected in the pixel. The plurality of pixels include the separation pixel PA in which the separation driving voltage line 1721 is formed and the connection pixel PB in which the connection driving voltage line 1722 is formed.

The separation pixel array PAC, including a plurality of separation pixels PA disposed in the column direction, and the connection pixel array PBC, including a plurality of connection pixels PB disposed in the column direction, are alternately disposed.

At this point, the separation driving voltage line is separated by the separation interval W in the pixel for the separation pixel PA such that the area where the separation driving voltage line and the data line are close to each other is minimized, and accordingly, a short between the driving voltage line and the data line is minimized, and the success ratio of the laser repair is increased.

Also, the area of the separation driving voltage line is smaller than the area of the connection driving voltage line such that the overlapping area of the driving voltage line and the pixel electrode is reduced, thereby reducing the defect ratio such as a short due to overlying foreign materials.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. An organic light emitting diode (OLED) display, comprising a substrate, and a plurality of pixels formed on the substrate;
   each pixel including:
      a scan line formed on the substrate and transmitting a scan signal;
      a data line and a driving voltage line crossing the scan line and transmitting a data signal and a driving voltage, respectively;
      a switching thin film transistor connected to the scan line and the data line;
      a driving thin film transistor connected to a switching drain electrode of the switching thin film transistor; and
      an organic light emitting diode connected to a driving drain electrode of the driving thin film transistor,
      the plurality of pixels including
         a separation pixel at which the driving voltage line is terminated and
         a connection pixel at which the driving voltage line is connected,
         wherein an overlapping area between the driving voltage line and a pixel electrode of the separation pixel is smaller than an overlapping area between the driving voltage line and a pixel electrode of the connection pixel.

2. The organic light emitting diode display of claim 1, the separation pixel and the connection pixel being alternately disposed.

3. The organic light emitting diode display of claim 2, the separation pixel being disposed so as to be close to the connection pixel in a row direction.

4. The organic light emitting diode display of claim 3, the separation pixel being disposed so as to be close to the connection pixel in a column direction.

5. The organic light emitting diode display of claim 1, a separation pixel array including the separation pixel and a connection pixel array including the connection pixel being alternately disposed.

6. The organic light emitting diode display of claim 1, further comprising:
   a first gate insulating layer formed on the substrate; and
   a storage capacitor including a first storage capacitor plate formed on the first gate insulating layer, a second gate insulating layer covering the first storage capacitor plate, and a second storage capacitor plate formed on the second gate insulating layer and overlapping the first storage capacitor plate;
   the driving voltage line being connected to the second storage capacitor plate.

7. The organic light emitting diode display of claim 6, the driving voltage line including a separation driving voltage line formed in the separation pixel and a connection driving voltage line formed in the connection pixel.

8. The organic light emitting diode display of claim 7, the separation driving voltage line and the connection driving voltage line being connected to each other through the second storage capacitor plate.

9. The organic light emitting diode display of claim 6, further comprising:
   a compensation thin film transistor that is turned on by the scan signal to compensate a threshold voltage of the driving thin film transistor, and that is connected to the driving thin film transistor; and
   an initialization thin film transistor that is turned on according to a previous scan signal transmitted through a previous scan line separated from the scan line, and transmitting an initialization voltage transmitted through an initialization voltage line close to the previous scan line to the driving gate electrode of the driving thin film transistor;
   the separation driving voltage line not crossing the initialization voltage line and the previous scan line.

10. The organic light emitting diode display of claim 9, the separation driving voltage line including one separation terminal positioned at one side with reference to the initialization voltage line and the previous scan line, and another separation terminal positioned at another side with reference to the initialization voltage line and the previous scan line.

11. The organic light emitting diode display of claim 10, further comprising:
   an interlayer insulating layer covering the second storage capacitor plate;
   a connection member formed on the interlayer insulating layer and connected to the driving gate electrode through a contact hole formed in the interlayer insulating layer; and
   a protective layer covering the interlayer insulating layer and the connection member;
   the connection member being connected to a compensation drain electrode of the compensation thin film transistor; and
   said another separation terminal of the separation driving voltage line being connected to the second storage capacitor plate through a contact hole formed in the interlayer insulating layer.

12. The organic light emitting diode display of claim 11, further comprising:
   an operation control thin film transistor that is turned on by a light emission control signal transmitted by a light emission control line separated from the scan line, and transmitting the driving voltage to the driving thin film transistor; and
   one separation terminal of the separation driving voltage line being connected to the operation control source electrode of the operation control thin film transistor through a contact hole formed in the interlayer insulating layer.

13. The organic light emitting diode display of claim 12, the scan line being formed with a same layer as the second storage capacitor plate, and the data line and driving voltage line being formed with a same layer as the connection member.

14. The organic light emitting diode display of claim 12, the initialization voltage line being formed with a same layer as the scan line, and the previous scan line being formed with a same layer as the light emission control line.

* * * * *